US007910410B2

(12) United States Patent
Cai

(10) Patent No.: US 7,910,410 B2
(45) Date of Patent: Mar. 22, 2011

(54) INTEGRATED LOW LEAKAGE SCHOTTKY DIODE

(75) Inventor: Jun Cai, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/788,626

(22) Filed: May 27, 2010

(65) Prior Publication Data

US 2010/0233862 A1 Sep. 16, 2010

Related U.S. Application Data

(63) Continuation of application No. 12/107,995, filed on Apr. 23, 2008, now Pat. No. 7,745,845.

(51) Int. Cl.
*H01L 21/332* (2006.01)

(52) U.S. Cl. ......... 438/134; 257/119; 257/155; 257/162; 257/E29.214; 257/E29.215

(58) Field of Classification Search .................. 438/134; 257/119, 155, 162, E29.214, E29.215
See application file for complete search history.

(56) References Cited

U.S. PATENT DOCUMENTS 5,504,362 A 4/1996 Pelella et al.
5,886,383 A 3/1999 Kinzer
6,005,283 A 12/1999 Kim et al.
6,034,413 A 3/2000 Hastings et al.
6,762,097 B2 7/2004 Takei et al.
7,045,830 B1 5/2006 Cai et al.
7,064,407 B1 6/2006 Mallikarjunaswamy et al.
7,285,828 B2 10/2007 Salcedo et al.
7,728,403 B2 * 6/2010 Harris et al. .................. 257/484
2003/0127687 A1 7/2003 Kumagai et al.
2006/0118814 A1 6/2006 Cai

OTHER PUBLICATIONS

Brian Winstead and Umberto Ravaioli, "Simulation of Schottky Barrier MOSFETs with a Coupled Quantum Injection/Monte Carlo Technique", IEEE Transactions on Electron Devices, vol. 47, No. 6, Jun. 2000.
V. Khemka, V. Parthasarathy, R. Zhu and A. Bose, "HMS Rectifier: A Novel Hybrid MOS Schottky Diode Concept with No Barrier Lowering, Low Leakage Current and High Breakdown Voltage", Proceedings of the 17th International Symposium on Power Semiconductor Devices & ICs, May 23-26, 2006, Santa Barbara, CA, 0-7803-8889-5/05, 2005 IEEE.
International Search Report of corresponding PCT Application No. PCT/US08/088595, dated Jun. 24, 2009, 2 pgs.

* cited by examiner

*Primary Examiner* — Tu-Tu V Ho
(74) *Attorney, Agent, or Firm* — Thomas R. FitzGerald, Esq.; Hiscock & Barclay, LLP

(57) ABSTRACT

An integrated low leakage Schottky diode has a Schottky barrier junction proximate one side of an MOS gate with one end of a drift region on an opposite side of the gate. Below the Schottky metal and the gate oxide is a RESURF structure of an N− layer over a P− layer which also forms the drift region that ends at the diode's cathode in one embodiment of the present invention. The N− and P− layers have an upward concave shape under the gate. The gate electrode and the Schottky metal are connected to the diode's anode. A P− layer lies between the RESURF structure and an NISO region which has an electrical connection to the anode. A P+ layer under the Schottky metal is in contact with the P− layer through a P well.

9 Claims, 11 Drawing Sheets

100
24
72
52
22
16
30
32
106
44
56
42
50
104
102
48
62

INTEGRATED LOW LEAKAGE SCHOTTKY DIODE

CROSS-REFERENCE TO RELATED APPLICATIONS

This application is a continuation of U.S. patent application Ser. No. 12/107,995 filed Apr. 23, 2008, the entire specification of which is hereby incorporated by reference.

FIELD OF THE INVENTION

This invention relates to Schottky diodes present in silicon integrated circuits.

BACKGROUND OF THE INVENTION

Schottky diodes have desirable characteristics such as improved switching speeds and a lower forward voltage drop compared to PN junction diodes, base-emitter junctions in bipolar transistors or free wheeling diodes in DMOS transistors, for example. The Schottky diode can be used to shunt high transient currents which would otherwise pass through the PN junctions and possibly damage these transistors.

However, silicon Schottky diodes may have other undesirable characteristics related to reverse bias leakage and interfacial dipole which limit the breakdown voltage of the diodes.

SUMMARY OF THE INVENTION

The invention comprises, in one form thereof, a diode having an anode and a cathode with a metal portion of a Schottky barrier junction coupled to the anode or the cathode, an insulated gate having one side thereof adjacent the metal portion and having an electrode electrically coupled to the metal portion, and a first end of a drift region adjacent an opposite side of the gate with a second end of the drift region coupled to the cathode if the metal portion is connected to the anode, and to the anode if the metal portion is connected to the cathode.

In another form, the invention includes a method of forming a diode having an anode and a cathode. The method comprises the steps of forming a metal portion of a Schottky barrier junction that is coupled to the anode or the cathode, forming an insulated gate having one side thereof adjacent the metal portion and having an electrode electrically coupled to the metal portion; and forming a first end of a drift region adjacent an opposite side of the gate with a second end of the drift region coupled to the cathode if the metal portion is connected to the anode, and to the anode if the metal portion is connected to the cathode.

BRIEF DESCRIPTION OF THE DRAWINGS

The features and advantages of this invention, and the manner of attaining them, will become apparent and be better understood by reference to the following description of the various embodiments of the invention in conjunction with the accompanying drawings, wherein.

Figure 1:
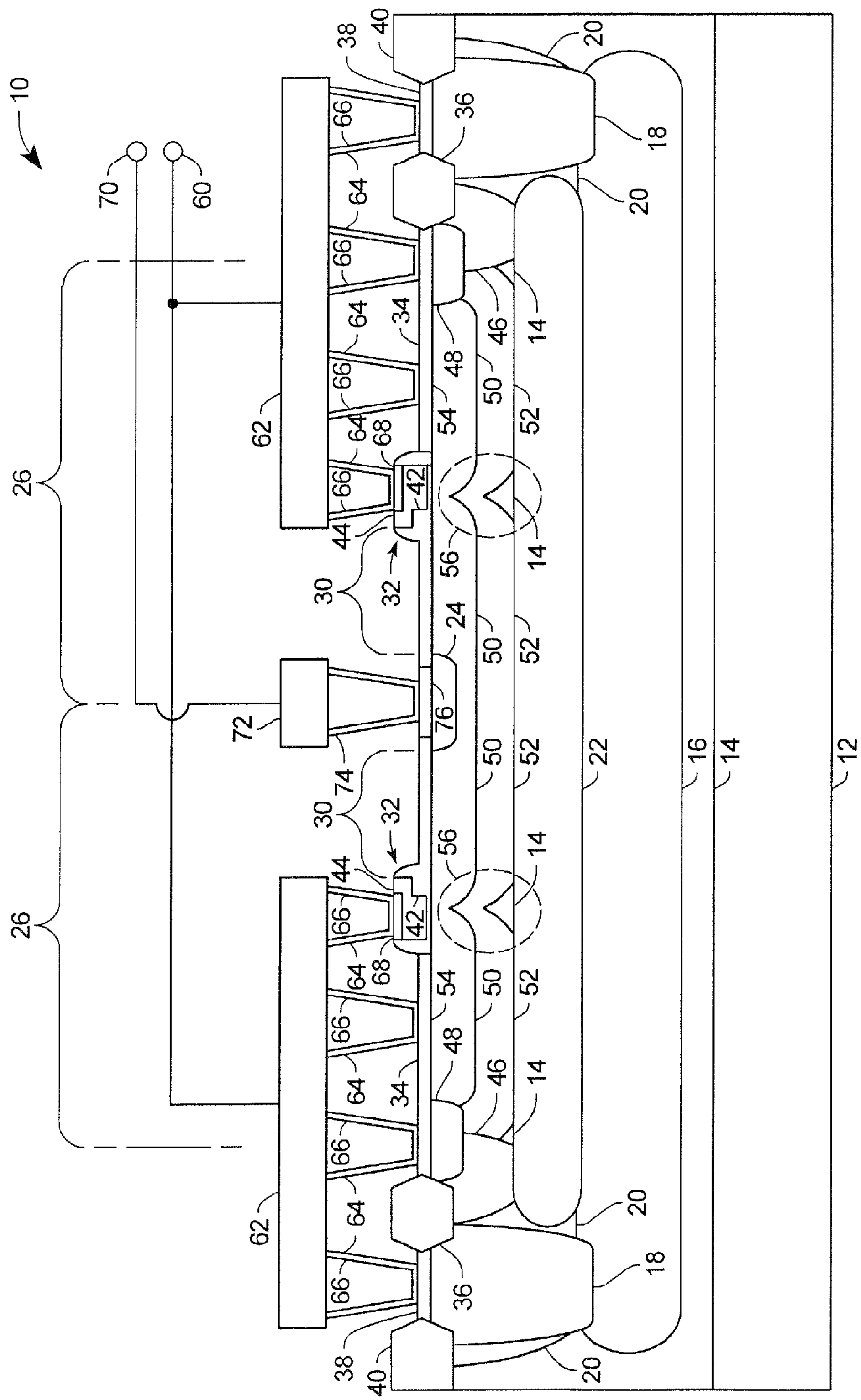
FIG. 1 is a diagrammatical side view of an embodiment an integrated low leakage Schottky (ILLS) diode according to the present invention.

It will be appreciated that for purposes of clarity, and where deemed appropriate, reference numerals have been repeated in the figures to indicate corresponding features. Also, the relative size of various objects in the drawings has in some cases been distorted to more clearly show the invention. The examples set out herein illustrate several embodiments of the invention but should not be construed as limiting the scope of the invention in any manner.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the term "first conductivity type" and "second conductivity type" refer to opposite conductivity types such as N or P-type, however, each embodiment described and illustrated herein includes its complementary embodiment as well although the anode and cathode contacts will be reversed in an embodiment that is the complement of the ILLS diode described below. Like numbers refer to like elements throughout.

Turning to the drawings, FIG. 1 is a diagrammatical side view of an embodiment an integrated low leakage Schottky (ILLS) diode 10 according to the present invention which is formed on a P+ substrate 12 with a P− epitaxial layer 14 formed thereon. The ILLS diode 10 includes in one embodiment thereof a N type isolation (NISO) layer 16 with N+ sinks 18 at each of the ends which extend from the NISO layer 16 to the upper surface of the epitaxial layer 14. The N+ sinks 18 have N regions 20 in FIG. 1, which in one embodiment of the present invention are not present as described in more detail below in the discussion of FIG. 4B. A P-type diffusion 22 is above and in contact with the NISO layer 14.

As shown in FIG. 1 the ILLS diode 10 has an N+ central cathode 24 which is between two silicide anode regions 34 which are mirror images of each other. There are two unit regions 26 in FIG. 1. More specifically, each unit region 26 includes a drift N− extension region 50 which extends from the N+ central cathode 24 to a gate 32 (region 30) and also extension to the other side of the gate, underneath a silicide layer 34, terminating at a P+ anode region 48. The silicide layer 34 is in contact with both the drift extension region 50 and the P+ anode region 48, and terminates at the field oxide segment 36. On the opposite side of the field oxide 36 is a silicide contact 38 which contacts the N+ sink 18. Another field oxide segment 40 is on the other side of the silicide contact 38. The gate 32 has a split level gate oxide 42, and the gate electrode 44 is consequently split level as well. In another embodiment of the invention the gate 32 could instead have a single level gate oxide and a single level gate electrode (not shown in the drawings).

Partially under the field oxide 36 is a P well 46 which extends downward to the P diffusion 22 and is in contact on one side with the N region 20 if it is present. A P+ anode region 48 extends partially into the upper surface of the P well 46 and is in contact with the silicide layer 34. An N− extension 50 is in the upper surface of the epitaxial layer 14 in contact with the silicide layer 34. The N− extension 50 extends to the N+ central cathode 24 in each of the unit regions 26. The silicide 34 and the N− extension 50 form a Schottky barrier junction 54. A P− extension 52 lies under, and is in contact with, the N− extension 50 and is also in contact with the P+ anode region 48 and the P well 46.

Both the N− extension 50 and the P− extension 52 are substantially of constant thickness except for an area 56 under the gate 32 where they form a narrow concave-shaped conduction channel. The bottom surface of the P− extension 52 is in contact with the P diffusion 22 except in the area 56 under the gate 32.

The anode terminal 60 of the ILLS diode 10 is connected through a metal 1 section 62 and contacts 64 to a silicide 68 formed in a gate electrode 44 of the gate 32, to the silicide layer 34, and to the silicide contact 38. The cathode terminal 70 is connected through another metal 1 section 72 and a contact 74 to a silicide 76 formed in the upper surface of the N+ central cathode 24. The contacts 64 and 74 may be titanium with a titanium-nitride outer layer 66.

Figure 2:
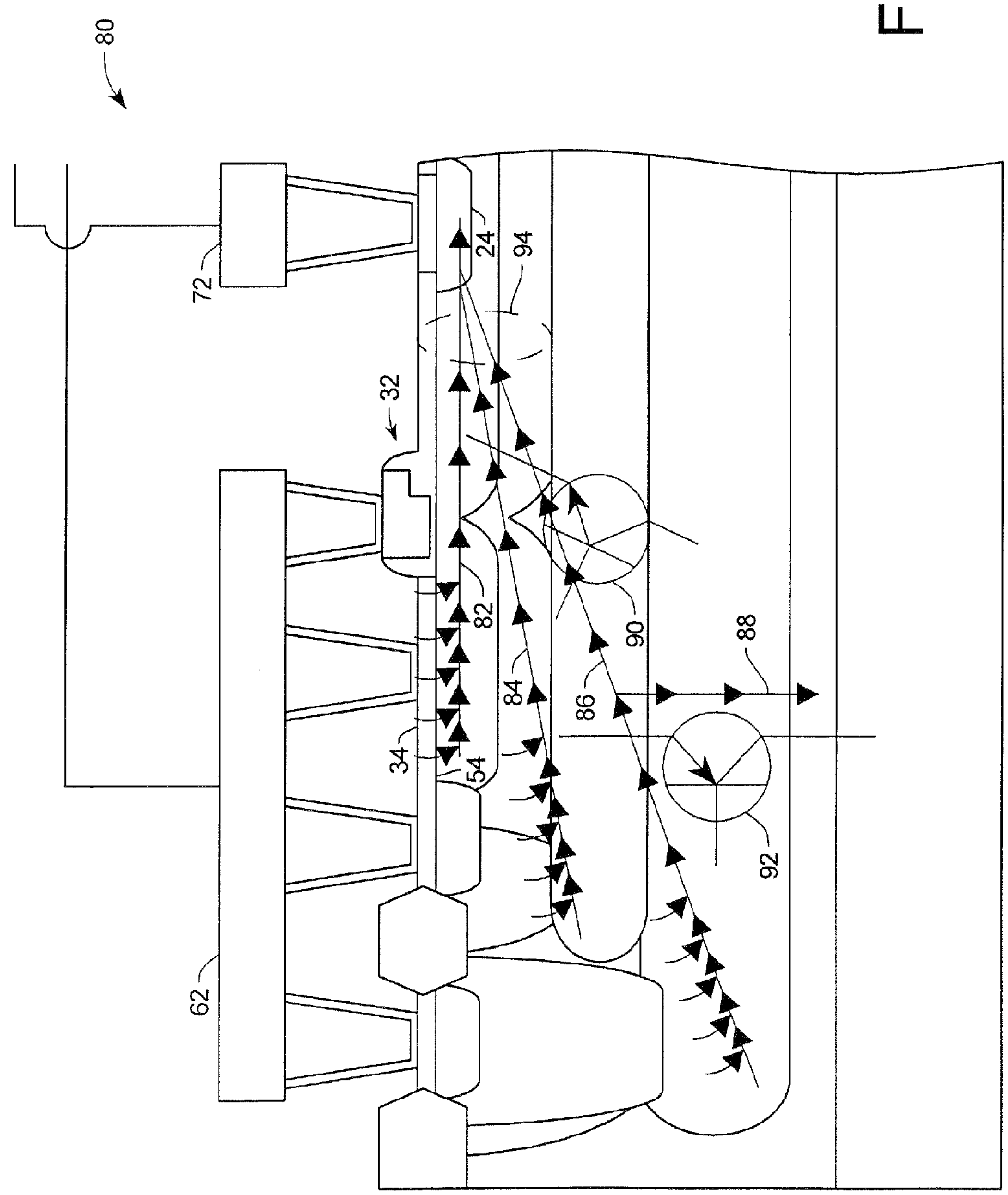
FIG. 2 is a portion of the ILLS diode shown in FIG. 1 with added symbols indicating the main current flow together with two parasitic bipolar transistors.

FIG. 2 is a portion 80 of the ILLS diode 10 with added symbols indicating the main current flow along which is along lines 82, 84, 86, and 88, together with two parasitic bipolar transistors, an NPN parasitic transistor 90 and a PNP parasitic transistor 92 to facilitate an explanation of the turn-on and forward conduction characteristics of the diode 10. At initial turn-on the gates 32 and the N− extension regions 50 operate as punch-through MOSFETs, and together with the Schottky barrier junctions 54 provide forward conduction current path for the ILLS diode 10 as indicated by the arrows touching line 82. As the anode-to-cathode voltage rises, the PN junctions between the P+ anode regions 48, the P wells 46, the P diffusion 22, the P− extensions 52 and the N− extensions 50 begin to conduct as indicated by the arrows touching line 84. In addition the parasitic NPN transistor 90 becomes conductive to provide a current path from the N+ sinks 18 and the NISO layer 16 to the N− extension 50 as indicated by the arrows touching line 86. The turn-on of the parasitic NPN transistor 90 drops the forward-bias voltage at the junction of the P diffusion 22 and the NISO layer 16 which, in turn, can reduce the substrate leakage created by the parasitic PNP transistor 92 as indicated by the arrows toughing line 88.

Figure 3:
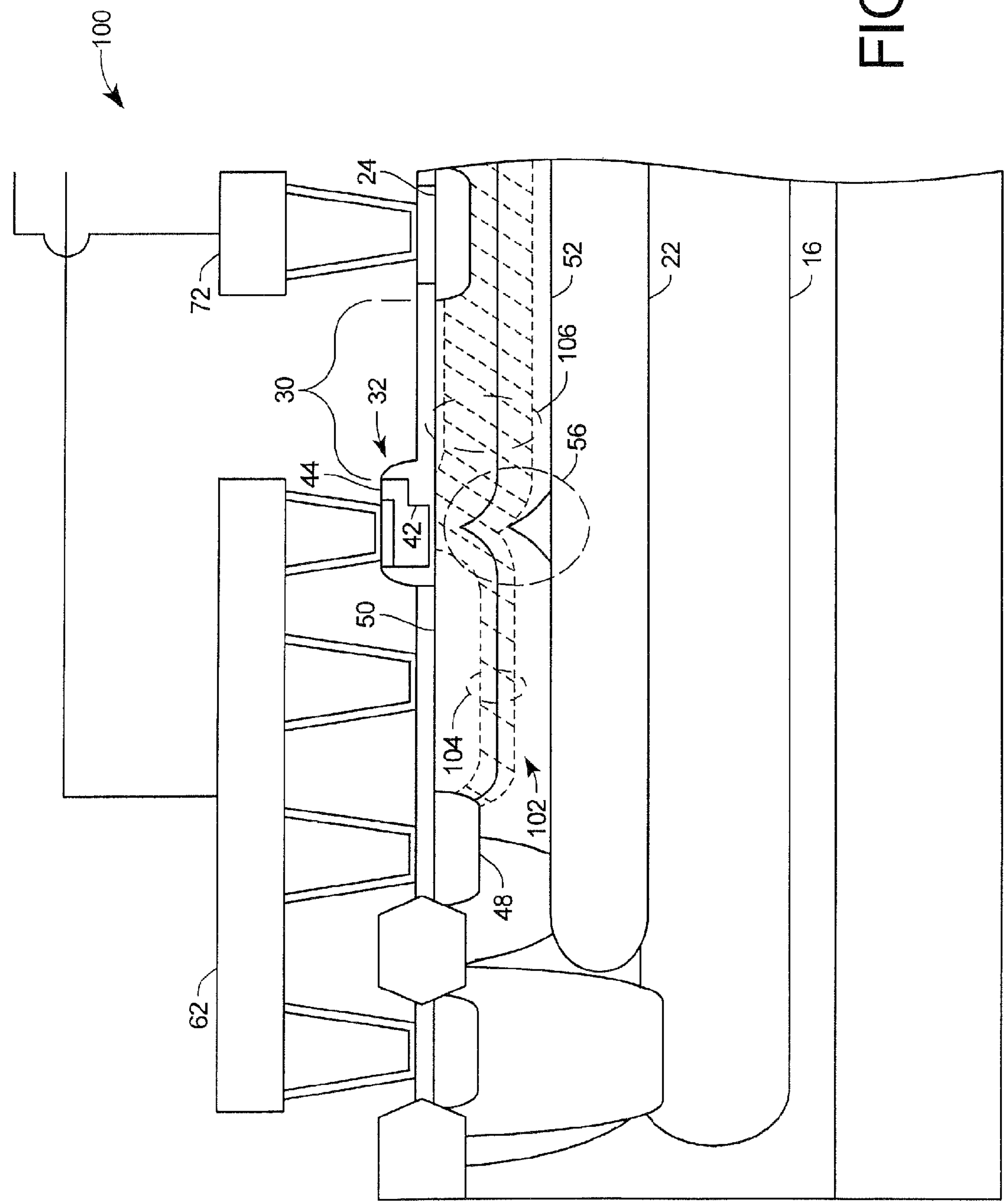
FIG. 3 is a portion of the ILLS diode shown in FIG. 1 with a depletion region shown by dashed lines to aid in the discussion of the reverse bias characteristics on the ILLS diode.

The stacked N− extension 50, P− extension 52, in the drift region 30, as indicated in FIG. 3 by the broken-line ellipse 94, have a RESURF design which enhances the blocking voltage capability of the ILLS diode 10 when reversed-biased. Also during the device anode to cathode forward conduction, the RESURF design reduces the channel conduction resistance which results in a relatively small anode and cathode areas compared to conventional integrated circuit Schottky diodes.

After the anode voltage increases, the Schottky junction 54 between silicide 34 to N− extension 50 is turned-on, there is a current flowing from anode 60 to cathode 70 through the concave-shaped punch-through channel region 56. The increase of the N type carriers from the main-gate electrode 44, and the back-gate effect of the P− extension 52 to the N− extension 50 bias, can further improve the channel conductivity.

The three main current paths 82, 84, and 86 limit the vertical substrate minority carrier injection, indicated by the arrows touching line 88, by the parasitic PNP transistor 92.

FIG. 3 is a portion 100 of the ILLS diode 10 with a depletion region 102, shown by dashed lines to aid in the discussion of the reverse bias characteristics on the ILLS diode 10. The depletion region 102 has two sections, a first depletion section 104 extending from the P+ anode region 48 to the gate 32, and a second depletion section 106 in the drift region 30. When the cathode-to-anode voltage initially becomes positive, the narrow concave-shaped conduction channel 56 under the gate electrode 44 will become fully depleted as the N− extension 50 floats positive and the reverse bias back gate reverse biases the N− extension 50 and the P− extension 52. As a result the Schottky barrier 54 reverse bias leakage will be significantly reduced.

At higher cathode-to-anode voltages the RESURF structure of the drift region 30 will be fully depleted and can support a high cathode-to-anode breakdown voltage in a relatively small cathode area. Since the narrow concave-shaped conduction channel 56 under the gate electrode 44 will be fully depleted, the depletion section 104 is narrower than the depletion section 106.

The split gate oxide 42, with the thicker gate oxide under the portion of the gate electrode 44 adjacent to the drift region 30, produces a reduced electric field at the edge of the drift region 30 which further improves the device off-state performance.

In addition, the P diffusion layer 22 increases the N+ central cathode 24 to the NISO layer 16 punch-through breakdown voltage.

Figure 4A:
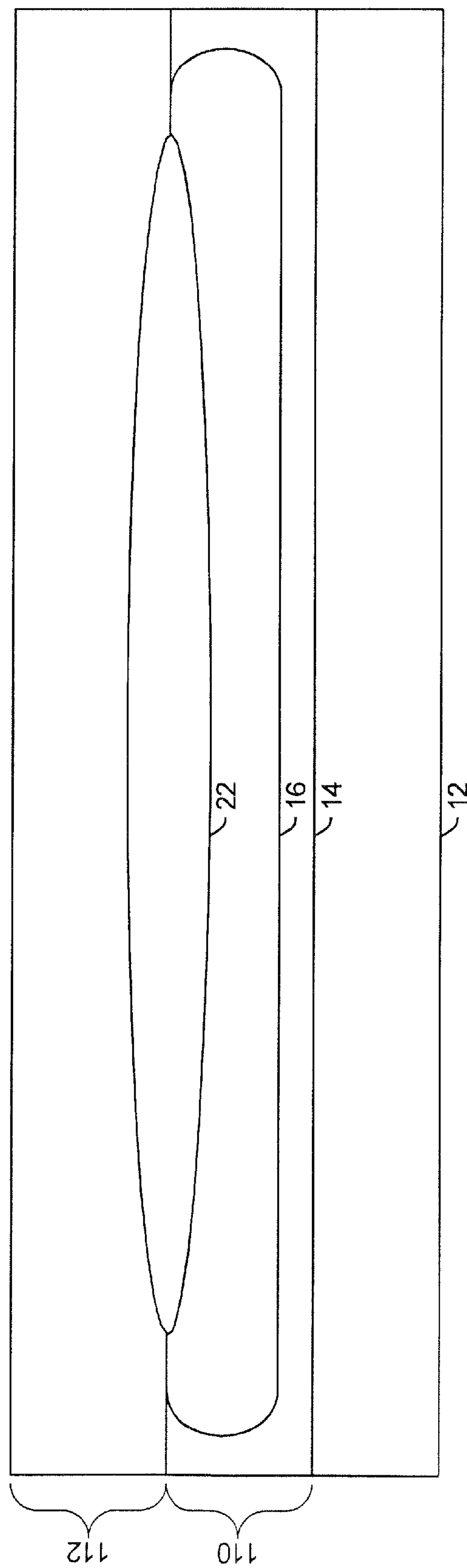
FIGS. 4A, 4B, 4C, 4D, and 4E depict selected stages in the formation of the ILLS diode shown in FIG. 1.

FIGS. 4A-4E depict selected stages in the formation of the ILLS diode 10. In FIG. 4A the epitaxial layer 14 has been grown on the substrate 12 in two steps. The base epitaxial layer 110 is first grown, and the NISO layer 16 and P− diffusion 22 are formed in the base epitaxial layer 110. A P− in-line epitaxial layer 112 is then grown to complete the P− epitaxial layer 14.

Figure 4B:
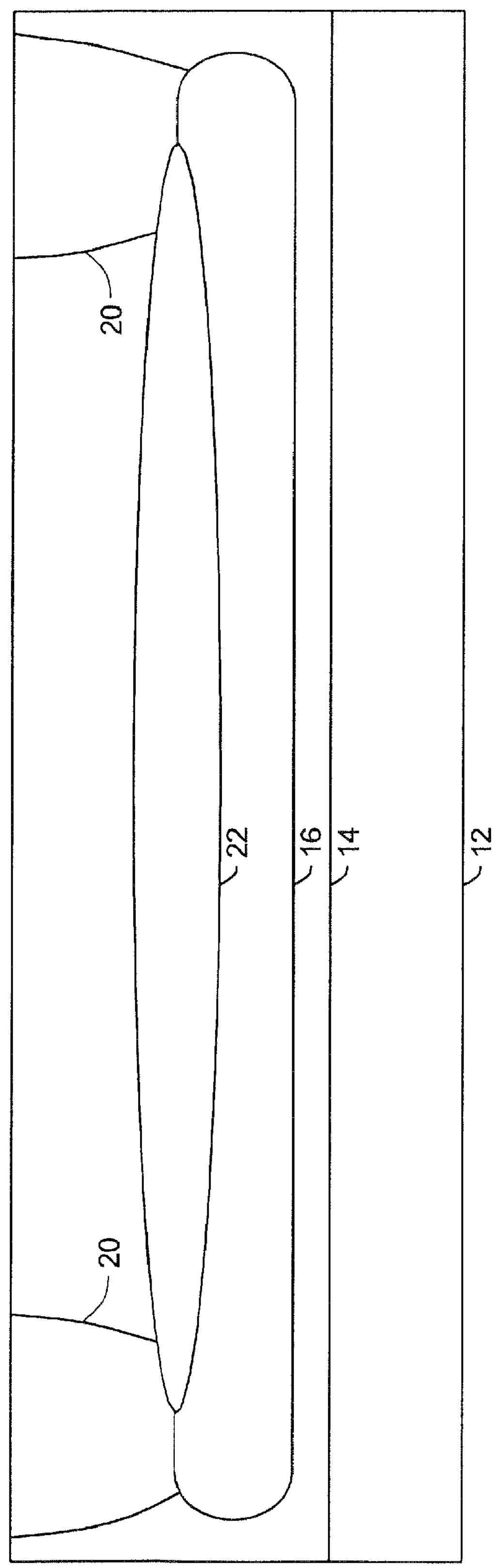

FIG. 4B shows the optional N regions 20. The N regions 20 increase the anode to substrate breakdown voltage. However, forming the N regions 20 requires another mask, but the additional mask may be part of the mask used to form a high voltage Nwell in an LDMOS device which may also be part of the same chip. Without the N regions 20 the anode the substrate breakdown voltage will be essentially the breakdown voltage from the N+ sinks 18 to the substrate 12.

Figure 4C:
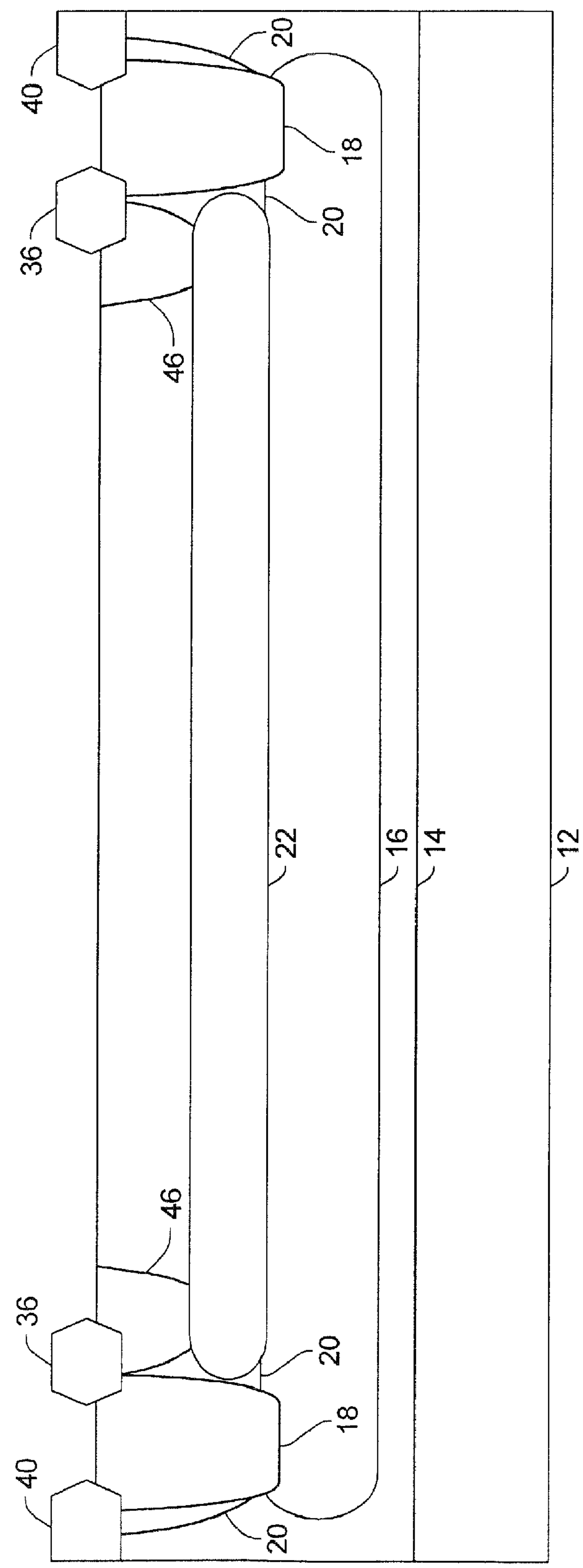

In FIG. 4C the field oxides 36 and 40 are formed after the N+ sinks 18 implant process, which drive the N+ sinks 18 deep during the field oxide thermal diffusion, and the P wells 46 are then formed self-aligned with the field oxides 36.

Figure 4D:
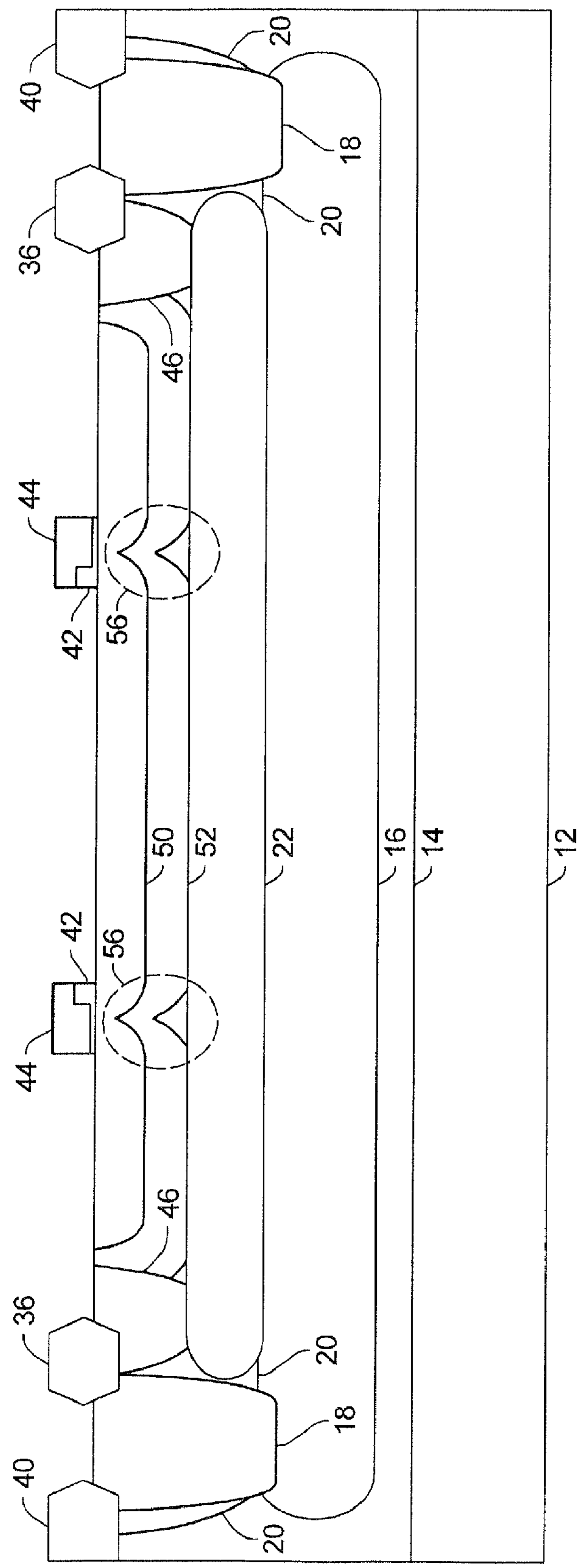

The split gate oxides 42 and the gate electrodes 44 are shown added in FIG. 4D along with the N− extension region 50 and the P− extension region 52. The N− extension region 50 and the P− extension region 52 are heterodoped, meaning that the same mask is used for forming both regions, and they are self aligned with the gate electrodes 44. Using the electrodes 44 as part of the masks for the N− and P− extensions 50, 52 creates the concave shaped conduction channels 56 under the gate electrodes 44. In one embodiment the dopant concentration of the N− extension 50 is between 8e15 $cm^{-3}$ and 1e18 $cm^{-3}$, with a depth of between 0.15 μm and 0.8 μm except at the ends and in the concave shaped conduction channels 56. In the same embodiment the dopant concentration of the P− extension 52 is between 5e15 $cm^{-3}$ and 7e17 $cm^{-3}$ with a depth of between 0.2 μm and 1.2 μm except at the ends and in the concave shaped conduction channels 56. The length of gate electrodes 44 is between 0.13 μm and 0.8 μm in the same embodiment.

Figure 4E:
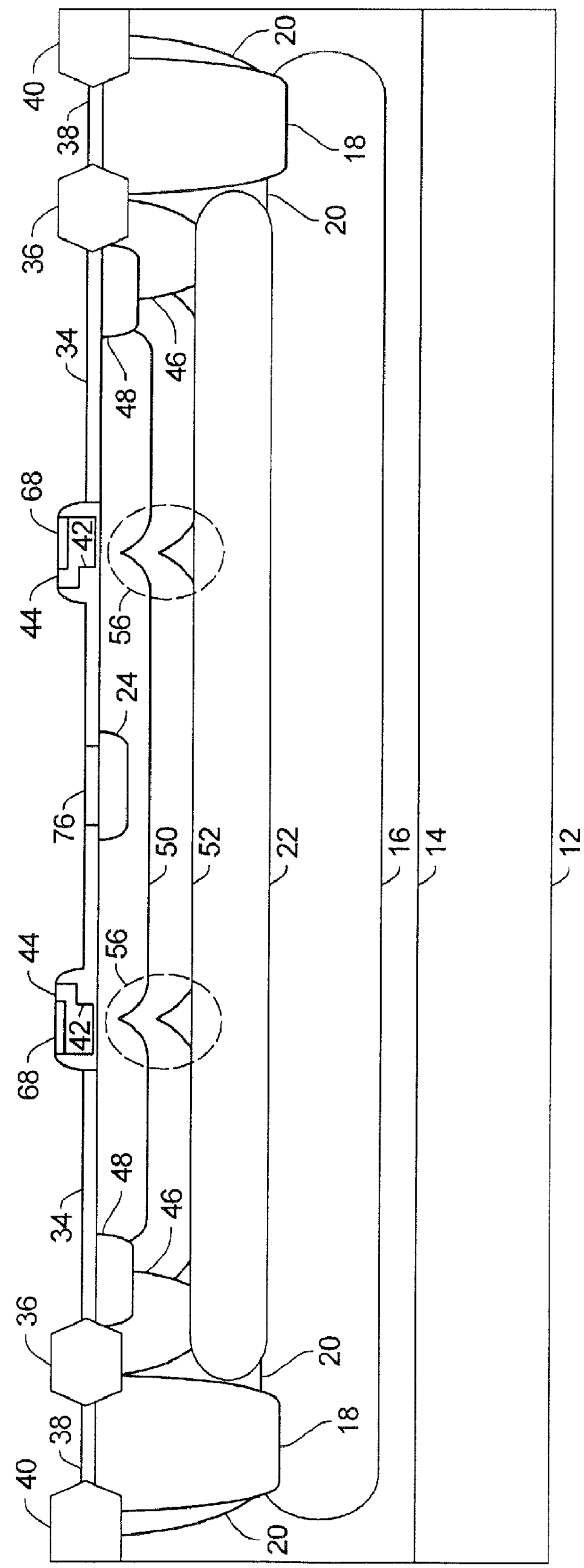

FIG. 4E shows the addition of the N+ central cathode 24, P+ anode region 48, the sidewall oxides to the gates 32, the oxide layers in the drift regions 30, and the silicide contacts 34, 38, 68, and 76. The contacts 64 to the metal 1 segments 62 and 72 are then formed to complete the ILLS diode 10 shown in FIG. 1.

Figure 5:
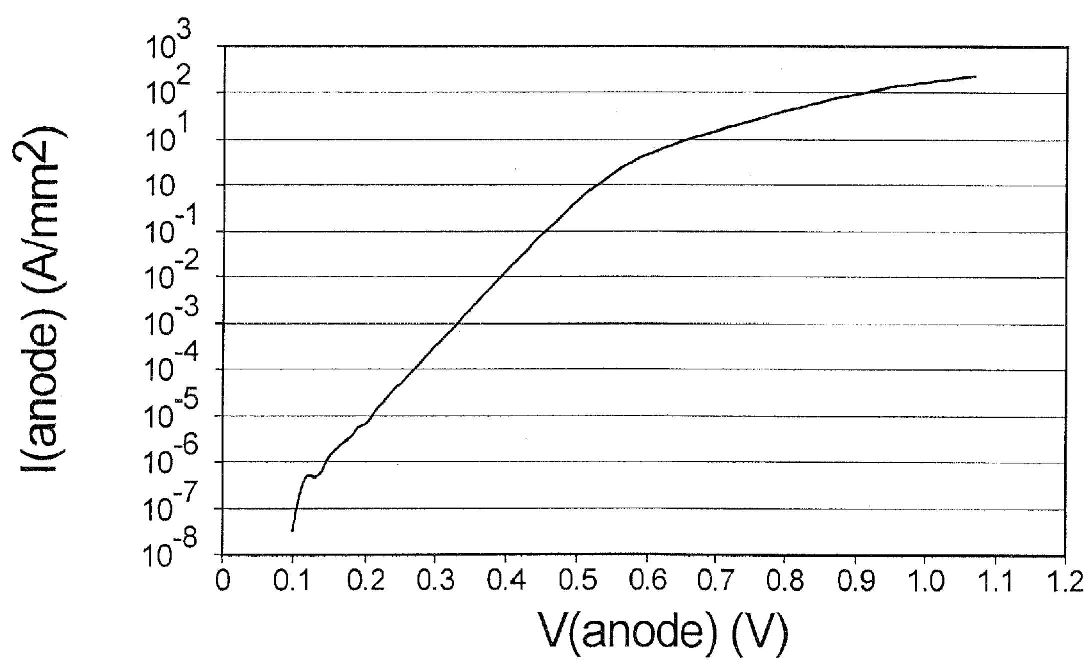
FIG. 5 is a plot of the measured anode current density versus the anode-to-cathode forward voltage drop of an ILLS diode of the type shown in FIG. 1.

FIG. 5 is a plot of the measured anode current density versus the anode-to-cathode forward voltage drop. As can be seen as anode current density of 10 A/$mm^2$, the forward voltage drop is about 0.66 volts.

Figure 6A:
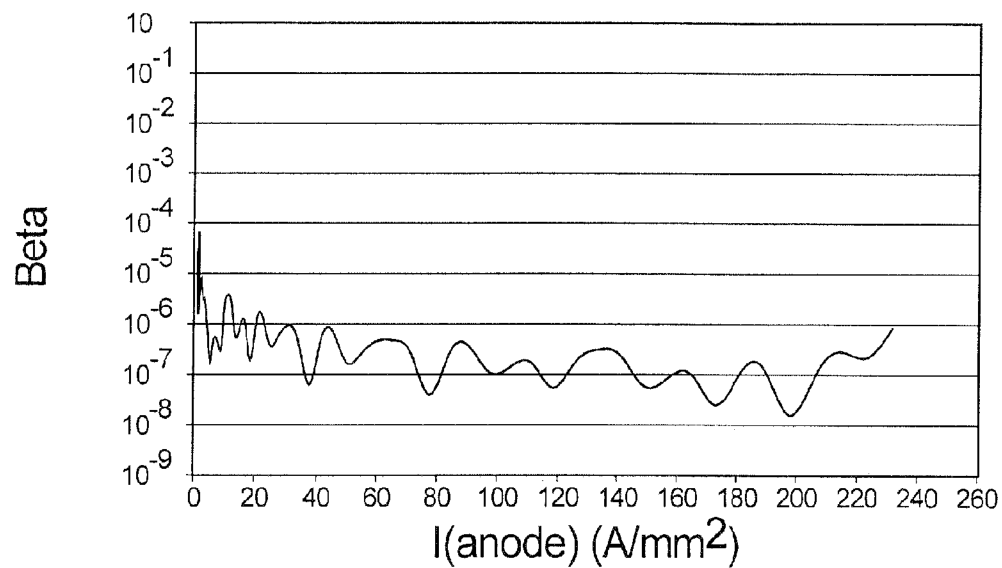
FIGS. 6A and 6B show the derived beta of the parasitic PNP transistor 92 and the substrate current density, respectively, as a function of the anode current density of an ILLS diode of the type shown in FIG. 1.
Figure 6B:
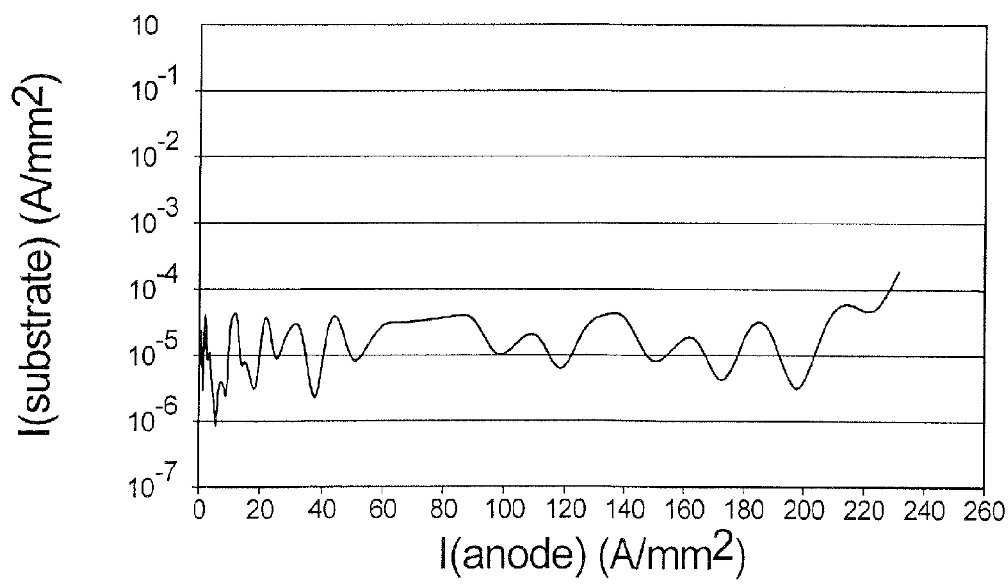

FIGS. 6A and 6B show the derived beta of the parasitic PNP transistor 92 and the substrate current density, respectively, as a function of the anode current density. As shown in FIG. 6A an anode current density of 220 A/$mm^2$ results in a parasitic substrate PNP beta of around $5\times10^{-7}$. As shown in FIG. 6B the substrate current is very low even at an anode current density of 220 A/$mm^2$.

Figure 7A:
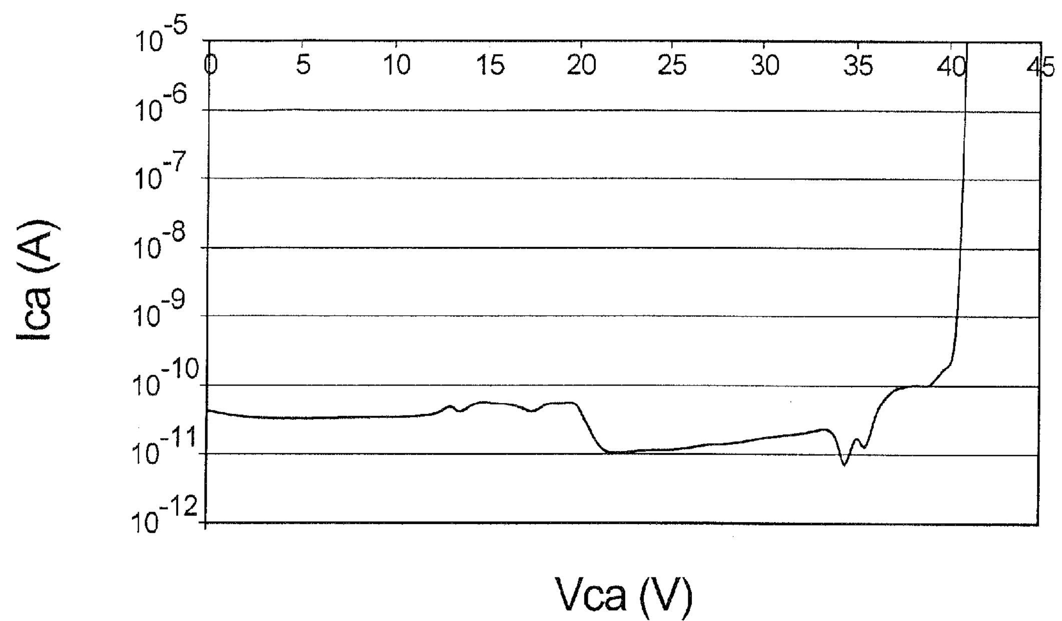
FIG. 7A shows the measured cathode-to-anode reverse bias current as a function of the cathode-to-anode voltage of an ILLS diode of the type shown in FIG. 1.
Figure 7B:
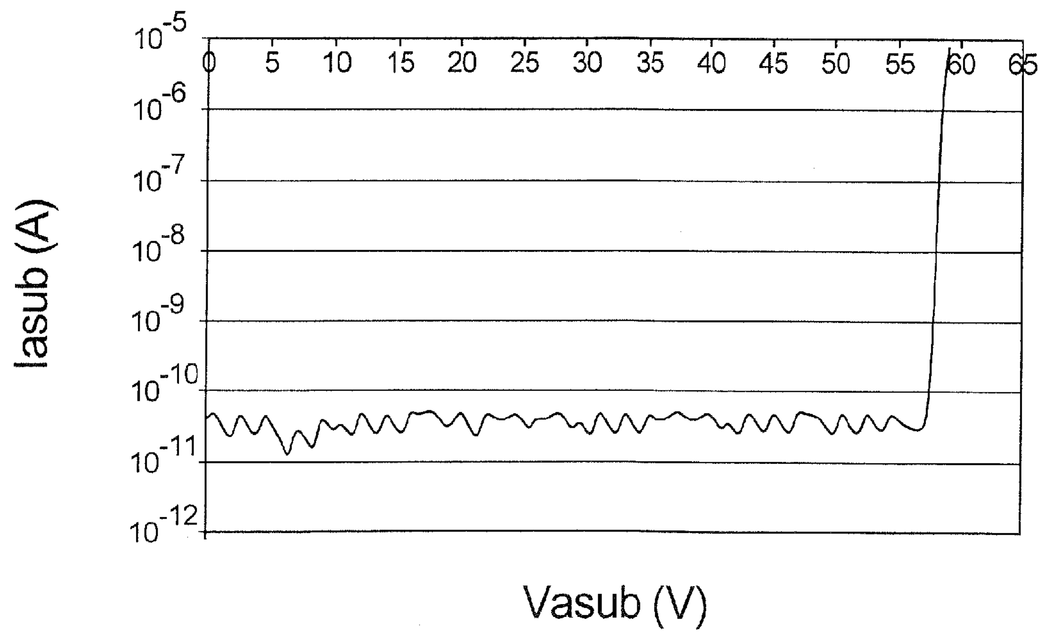
FIG. 7B shows the derived substrate current as a function of the anode-to-substrate voltage of the type shown in FIG. 1.

FIG. 7A shows the measured cathode-to-anode reverse bias current as a function of the cathode-to-anode voltage, and FIG. 7B shows the derived substrate current as a function of the anode-to-substrate voltage. As can be seen in FIG. 7A the breakdown voltage is around 41 volts. As shown in FIG. 7B the anode-to-substrate breakdown voltage is around 55 volts, which shows that the ILLS diode 10 works well in a high-side or charge pump design.

The ILLS diode 10 is a very compact diode compared to conventional Schottky barrier diodes in integrated circuits. The anode area, the area with a width from the edge of the N region 20 farthest from the gates 32 at the surface of the epitaxial layer 14 to the closest edge of the closest gate electrode 44, can be as little as 375 $\mu m^2$. The length of the drift region 30 can be as short as 1.95 μm for a 40V volts Schottky diode, and the total surface area for the ILLS diode 10 can be as little as 1275 $\mu m^2$ in a 0.35 μm process code.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A method of forming a diode having an anode and a cathode comprising:

forming a metal portion of a Schottky barrier junction that is coupled to said anode or said cathode;

forming an insulated gate having one side thereof adjacent said metal portion and having an electrode electrically coupled to said metal portion;

forming a concave-shaped conduction channel under said insulated gate;

forming a first end of a drift region adjacent an opposite side of said gate with a second end of said drift region coupled to said cathode if said metal portion is connected to said anode, and to said anode if said metal portion is connected to said cathode;

forming a first layer of a first conductivity type under a gate oxide of said gate;

forming a second layer of a second conductivity type under, and in contact with, said first layer wherein said first layer and said second layer form a RESURF structure;

forming a first region of said second conductivity type in contact with said metal portion and said first layer; forming a well of said second conductivity type in contact with said first region; and forming a second region in contact with said well and said second layer.

2. The method set forth in claim 1 further including forming an isolation region of said first conductivity type under, and in contact with, said second region, said isolation region electrically coupled to said metal.

3. The method set forth in claim 1 wherein said first layer and said second layer form a concave-shaped conduction channel under said gate.

4. A method of forming a diode having an anode and a cathode comprising:

forming a metal portion of a Schottky barrier junction that is coupled to said anode or said cathode;

forming an insulated gate having one side thereof adjacent said metal portion and having an electrode electrically coupled to said metal portion;

forming a first end of a drift region adjacent an opposite side of said gate with a second end of said drift region coupled to said cathode if said metal portion is connected to said anode, and to said anode if said metal portion is connected to said cathode; and forming a layer having a substantially flat upper surface in contact with said metal portion and said gate oxide and extending into said drift region.

5. A method of forming a diode having an anode and a cathode comprising:

forming a metal portion of a Schottky barrier junction that is coupled to said anode or said cathode;

forming an insulated gate on a split level gate oxide, said insulated gate having one side thereof adjacent said metal portion and having an electrode electrically coupled to said metal portion; and forming a first end of a drift region adjacent an opposite side of said gate with a second end of said drift region coupled to said cathode if said metal portion is connected to said anode, and to said anode if said metal portion is connected to said cathode.

6. A method of forming a diode having an anode and a cathode comprising the steps of:

forming a horizontal isolation region of a first conductivity type in an epitaxial layer of a second conductivity type;

forming a first layer of said second conductivity type on, and in contact with, said isolation region;

forming first and second regions of said second conductivity type in contact with each other which together extend from said first layer to a first silicide segment, said first silicide segment forming a metal layer of a Schottky barrier junction;

forming a second layer of said second conductivity type on and in contact with said first layer;

forming a third layer of said first conductivity type on and in contact with said second layer, said third layer in contact with said first silicide segment; and forming a gate having a first side proximate to said first silicide segment and extending over said second and third layers, said second and third layers having an upward concave shape under said gate, and said second and third layers extending from a side of gate opposite said first side to a second silicide segment;

wherein said first silicide segment forms one of said anode and said cathode, and said second silicide segment forms the other of said anode and said cathode.

7. The method set forth in claim 6 wherein said second and third layers form a RESURF structure.

8. The method set forth in claim 6 further including forming a sink of said first conductivity type from a third silicide segment in a top surface of said sink to said isolation region, said third silicide segment electrically coupled to said first silicide segment.

9. The method set forth in claim 6 wherein said gate is formed with a split level gate oxide and a split level gate electrode.

* * * * *